United States Patent Office 3,149,967 Patented Sept. 22, 1964

3,149,967

PROCESS FOR PREPARING PRINTING ELEMENT STENCILS FROM CLARIFIABLE POLYMERIC MATERIALS

Max Fredrick Bechtold, Kennett Square, Pa., assignor to E. I. du Pont de Nemours and Company, Wilmington, Del., a corporation of Delaware No Drawing. Filed Oct. 21, 1960, Ser. No. 63,953
9 Claims. (Cl. 96—27)

This invention relates to processes for preparing printing elements and more particularly letter press printing plates.

This application is a continuation-in-part of my application Serial No. 3,726, filed January 21, 1960, U.S. Patent 2,957,791, Oct. 25, 1960.

Printing is an important method for recording and duplicating information. In recent years there has been considerable effort expended on the development of methods for the preparation of printing plates for rapid and faithful reproductions. An especially useful technique involves photosensitive compositions, which after exposure to actinic light through an image-bearing medium and suitable development produce plates for direct use in printing. Examples of such plates are the photopolymer printing plates described in U.S. 2,791,504 and 2,927,022 and photolithographic plates (see, e.g., Mertle and Monsen, "Photomechanics and Printing," Mertle, Chicago, 1957, pages 275–322). To obtain high quality printing plates, it is important in these procedures to use a negative having a wide density differential between clear and opaque portions. In general, the particularly useful negatives have been obtained by photographic techniques which depend upon formation of silver images.

An object of this invention is to produce new and dependable processes for producing relief images. Another object is to provide such processes wherein the images can be used for printing. A further object is to produce such processes which are simple and utilize economical and available photographic equipment for printing photographic images. A still further and more specific object is to provide an improved process for preparing printing reliefs embodying image-wise exposure. Still further objects will be apparent from the following description of the invention.

According to the present invention, useful printing elements are obtained (*a*) by selectively clarifying areas of an opaque film of an organic polymer having open cell microscopic voids, (*b*) passing light through the resulting clarified areas to expose a light-sensitive, image-yielding element, and (*c*) processing the exposed element to form a printing image. The printing image from step (*c*) is used as a direct ink printing element or to expose a further light-sensitive, image-yielding element and the latter may be used as a direct ink printing image or to expose a further element to be used as a direct ink printing element. The opaque film is preferably clarified by pressure.

In a preferred aspect of the invention, printing reliefs are made by (*a*) selectively clarifying areas of an opaque film of an organic polymer having open cell microscopic, substantially uniform voids of average size less than a micron in diameter and constituting 20–80% of the volume of said opaque film and having a light transmission of less than 10% at 4000 A. [if a film of a thickness of at least 3 mils], said selectively clarified portions [after being subjected to pressure, e.g., 10,000 lbs. per sq. in.]

exhibiting a reduction in thickness of 20–80% and an increase in light transmission of at least three-fold with a substantial absence of microscopic voids by subjecting at least one surface of the film to pressure in said areas; (*b*) placing said selectively clarified opaque film in juxtaposition with an unexposed photosensitive plate or element; and (*c*) exposing a photosensitive element to light through the selectively clarified areas of said film. The exposed element is then processed to form a printing relief by removing unexposed portions of said film to relief height.

Prior to step (*c*), the unclarified background areas of the selectively clarified polymer film can be increased in optical density by deposition of an opaque material on the surface of such areas or within the open cell voids to give a high contrast image-bearing transparency.

Preferred opaque porous films which can be selectively cleared by pressure, heat, or solvent useful for the process of the present invention are described in application Serial No. 3,726, filed January 21, 1960, U.S. Patent No. 2,957,791, Oct. 25, 1960, and in the parent applications referred to in said application and in U.S. Patents 2,846,727 and 2,848,752 granted on certain of said parent applications. Such films are further characterized as follows: They are porous, opaque, non-fibrous films of low bulk density composed of partially coalesced discrete particles of a hydrophobic organic addition polymer of at least one ethylenically unsaturated monomer selected from the group consisting of vinyl and vinylidene monomers, said polymer having a wholly carbon chain, a molecular weight of at least 10,000, the units of the polymer having an average molecular weight of below 150 and preferably about 45 to about 150; said film having an open-cell structure characterized by microscopic voids uniformly disposed throughout and communicating with the surface, the open-cell voids, as measured by a conventional mercury intrusion method, being of substantially uniform size averaging less than a micron and preferably less than ½ micron in their average diameter and constituting 20% to 80% by volume of the film, said film (*a*) having a degree of opacity such that a thickness of 3 mils and greater has a light transmission of less than 10% at 4000 A., and upon being subjected to pressure, e.g., 10,000 pounds per square inch at room temperature has at least a 3-fold increase in light transmission, and (*b*) sustaining a permanent reduction in thickness of about 20% to about 80% when subjected to such pressure and temperatures. The low bulk density films are highly permeable, their permeability to water vapor being at least 10 times greater than the corresponding films of the same polymer and thickness which are non-porous or which have closed-cell voids. The films or coatings, because of the microscopic void structure communicating with the surface, are highly opaque. The bulk densities of the films, in general, are from about 0.25 to 1.0 gram per cc. The opacity of these films is such that not more than 10%, generally 5% or less, of light is transmitted (measured at 4000 A. on G.E. Spectrophotometer Cat. 5962004G65) using films of about 3 mils thickness. A further characteristic is that the clarified film (obtained by a pressure of about 10,000 lbs./sq. in. at room temperature, i.e., 25° C.) transmits at least three times as much light, generally over five and preferably ten times or more, as the opaque original film. In addition, the self-supporting or supported films or coatings have a high degree of receptivity to both aqueous and non-aqueous ink, irrespective of the specific polymer from which they are made. Thus, they are useful as films or sheets on which writing, typing, or printing may be performed.

The preferred porous, opaque, non-fibrous films can be prepared by the processes of my prior patents, namely U.S. Patents 2,846,727 and 2,848,752. One of these processes involves (1) the preparation of an aqueous dispersion of the polymer containing, based on the weight of the dispersion, from 10% to 50% of a water-soluble organic solvent for the polymer, the solvent being one which boils above 100° C. and being present in a concentration that is insufficient to dissolve the polymer, (2) shaping the dispersion in the form of a film or coating, (3) removing a substantial amount of the water and organic non-solvents by evaporation from the film until partial coalescense of the polymer occurs, as indicated by substantial clarification with tackiness, (4) washing the tacky structure with water or a liquid in which the polymer is insoluble but which dissolves the solvent for the polymer to produce a coherent film substantially free from dissolved polymer, followed by (5) washing the resultant film substantially free of organic solvent, after which the film is dried at a temperature below the softening point.

The other of such processes useful for the preparation of opaque, clearable, porous films, e.g., from polymethacrylonitrile or copolymers of acrylonitrile with 23–30% (on a molar basis) of isobutylene, involves the use of dispersions of these polymers in aqueous metal salt media as follows:

The polymer is dispersed in an aqueous medium having dissolved therein an inorganic salt in an amount of about 4% to about 55% based on the final composition. The salts that are effective in this process are those which in more concentrated solutions dissolve the polymer. Only non-solvent concentrations of the salt are used in making the dispersion. The dispersion is then shaped into a film and water is evaporated from the shaped structure until coalescence occurs. The salt is washed from the resultant shaped article. The shaped article can be readily plasticized by immersing the article while in the gel state in relatively non-volatile liquids or media containing such liquids which are softeners or plasticizers for the polymers. The dispersions contain less than 35% and generally at least 2% by weight of polymer, an amount of salt at least one-half the weight of the polymer but insufficient to form salt solutions which dissolve the polymer, the salt being one whose aqueous solution at a substantially higher concentration of salt and adequate temperature is a solvent for the polymer.

Opaque films have also been obtained by an alternate process. This comprises the formation of a clustered dispersion, for example, from a polyvinyl chloride dispersion in aqueous cyclohexanol, casting and partial evaporation to a non-flowable, crack-free condition. In this situation, only a slight clarification occurs during evaporation and tackiness does not develop even on heating to remove the non-solvent dispersion medium. A liquid polymer solvent, such as dioxane, is next applied by immersing or flooding the coating with it. Removal of solvent by washing is conducted immediately without additional evaporation. After washing and drying, a film is obtained with unusually high strength, opacity and porosity and which has a matte top surface which is less glossy than obtained by the usual process. The film has high ink receptivity. The separation and recovery of organic dispersion media from polymer solvent media is simplified by this process, which is also applicable to polystyrene.

The opaque films or coatings most useful for the process of this invention have uniform microscopic open-cell pores of average diameter of less than a micron and a major part less than ½ micron. The pores can be collapsed by the application of energy such as pressure and/or heat. Pressures of 10,000 lbs./sq. in. are generally sufficiently to clarify the film. The use of a solvent will also collapse pores, e.g., a pen dipped in a solvent drawn across the opaque film produces clear portions where the solvent contacts the film.

Because of their high opacity at 4000 A., the films are especially suitable for photoprinting normally conducted by exposure to light in the vicinity of 4000 A.

The opaque portions also accept ink readily and can be further opacified, e.g., by soaking in an aqueous solution of a black dye, Colour Index No. 15710, afterchromed with a ligand/chrome ratio of 2, blotting and drying. The optical density of the unclarified background areas can thus be increased to 4.5 or higher as measured with a Welch Densichron. Other dyes, e.g., Prussian Blue, and chromates as well as "in situ" deposition of optically dense materials such as lead sulfide as specifically illustrated herein give particularly useful dense backgrounds which contrast with the substantially transparent clarified areas of the film.

Preferably the difference in optical density between selectively clarified areas and the background should be at least 1.0. This permits the exposure of many photosensitive compositions to be carried out successfully without substantial reaction in those areas masked by the opaque areas. Post-densification as described above can be employed if the above difference in density is not directly attained. The deposition of optically dense material in the non-clarified open-cell porous portion is desirable since the resultant image-bearing film is considerably more durable, i.e., resistant to possible scratches, pressure, solvents, etc., to which it may be subject in use or handling.

The following examples illustrate specific embodiments of this invention.

*Example I*

An opaque, porous pressure-coalescible film of polymethacrylonitrile was prepared as described in U.S. 2,846,727 (see Example XXII). It was selectively clarified by hand by writing on it with a stylus. The negative so prepared was squeegeed onto a glass plate underneath a layer of cellophane and placed on a 30 mil layer of a photosensitive mixture comprising 70 parts of propylene plycol maleate-phthalate, 30 parts styrene, and one part benzolin methyl ether. Light was shown through the negative for ten minutes as described in Example VIII of U.S. 2,760,863. The exposed photosensitive composition was washed with an ethyl acetate/ethanol (87–13 by weight) solvent mixture and brushed to remove the unexposed areas leaving behind a printing plate comprising a polymeric image in relief. A printing was made from the plate by pressing it against a sheet of paper with an intermediate sheet of carbon paper. The printing was sharp and a faithful reproduction of the characters and writing originally scribed on the opaque, porous film of polymethacrylonitrile.

*Example II*

An opaque, porous, pressure-coalescible, dyeable, 0.8 mil coating of 50/50 vinyl chloride copolymer containing a minor amount of vinylidene chloride and 60/40 styrene/butadiene copolymer on a clear polyethylene terephthalate film base was prepared as described in my copending application Serial No. 3,726 (Patent No. 2,957,791). The coating was pressed against a heated copper engraving containing both type and half-tone areas using a conventional proof press. The selectively clarified coating was post-densified in the unchanged background areas by in situ deposition of lead sulfide at 50° C. This was accomplished by immersing the coating successively in lead nitrate and sodium sulfide solutions with intermediate blotting and final washing in water and drying. The lead sulfide deposits were optionally quite dense.

The selectively clarified, post-densified coating was held in a vacuum frame against a layer of a cellulose acetate-hydrogen succinate photosensitive printing plate composition containing triethylene glycol diacrylate as the monomer and anthraquinone as photoinitiator on a metal support, as described in U.S. 2,927,022 and U.S. 2,951,-758. The frame was exposed to a strong carbon arc light for about five minutes. The exposed photosensitive printing plate composition was "washed out" with caustic solution to remove the unexposed areas and produce the finished printing plate. Printings produced from the plate in the normal fashion by inking it and contacting it with a sheet of paper were of high quality, comparable even in the half-tone areas with those produced directly from the original copper engraving.

*Example III*

Opaque, porous, pressure-coalescible coatings about 1 mil thick on clear polyethylene terephthalate film bases were prepared from dispersions of the following polymers as described in my copending application Serial No. 3,726 (Patent No. 2,957,791):

(*a*) 50/50 copolymer mixture as in Example II above
(*b*) 90/10 vinyl chloride/ethyl acrylate copolymer
(*c*) 75 parts of an acrylonitrile/isobutylene copolymer containing 75 mole percent acrylonitrile and 25 parts of a butadiene/acrylonitrile copolymer (55/45)

The coatings were selectively clarified by pressing in a proof press against heated metal type forms. The unclarified background areas were post-densified to optical densities (Welch Densichron) of 2.9, 4.4, and 3.7, respectively, by in situ deposition of lead sulfide as described in Example II above. The negatives so produced were placed on commercial lithographic plates bearing a photosensitive composition and exposed to light. The plates were developed in the normal fashion and offset printings of good quality were made from the finished plates.

*Examples IV*

An opaque, porous, pressure-coalescible coating 1.2 mils thick on a clear polyethylene terephthalate film base was prepared from a dispersion of 90/10 vinyl chloride/ethyl acrylate copolymer as described in my copending application Serial No. 3,726 (Patent No. 2,957,791). The coating was selectively clarified by typing without a ribbon and by scribing of letters and drawings by hand with various styli. The unclarified background areas were post-densified to an optical density of 3.1 by dyeing with 2.5% aqueous solution of an afterchromed dye, Colour Index No. 15,710, at 50° C. for several minutes. From the coalesced negative thus prepared high quality reproductions of the original inscriptions on the opaque coating were produced by diazo process and photolithography.

*Example V*

An opaque, porous, pressure-coalescible layer of polyethylene terephthalate on clear polyethylene terephthalate film was prepared by exposing one side of an undrawn, 5-mil, polyethylene terephthalate, clear film to dimethylformamide for about three seconds followed by washing with water and drying. The layer was selectively clarified by scribing by hand with a stylus and by typing without a ribbon. The unclarified background was post-densified to an optical density of 1.5 by dyeing as in Example IV. The negative thus prepared was used as a mask during the exposure to light of a photolithographic paper plate. The plate was developed in the normal fashion and good printings were made therefrom.

*Example VI*

An opaque, porous, coalescible coating on a clear polyethylene terephthalate film base was prepared from a clear coating of a 1 to 2 mixture of 90/10 vinyl chloride/ethyl acrylate copolymer and a vinyl chloride copolymer with a larger amount of acrylate on clear, biaxially oriented ethylene terephthalate base by exposing the coating to dimethylformamide for about three seconds, washing in water, and drying. The coating was selectively clarified and post-densified to an optical density of 2.3 as in Example V. The negative was used as a mask as in Example V. Printings from the finished lithographic plate comprised faithful reproductions of the clear inscriptions on the original solvent opacified layer.

*Example VII*

A pressure-coalescible film prepared from an acrylonitrile/isobutylene/vinylidene chloride terpolymer (37.5/37.5/35 monomer charge weight ratio), using aqueous $Ca(SCN)_2$, was pressed with a metal type-form to give a clarified image in the film corresponding to the raised portions of the type. The film was soaked in a 10% solution of lead nitrate for 2–3 minutes, wiped dry, soaked in a 20% solution of sodium sulfide for 2–3 minutes, rinsed in water, and dried. This resulted in deposition of black lead sulfide only in the uncoalesced and porous areas of the film, with a large difference in optical density between the areas clarified by the type form and the rest of the film, i.e., a negative had been prepared by a non-photographic process.

The negative was used to expose a photopolymer printing plate as described in U.S. 2,760,863. With an exposure sufficient to hold 0.002 inch high light dots in a halftone, a good image was obtained in the final plate. That is, recesses in small o's, e's, etc. were of satisfactory depth. The plate was particularly suitable for letterpress printing.

The exact technique of producing transparent areas for the use of this invention can be varied. However, the most useful is by pressing type-face against the opaque polymer film. Printing shops generally have available many varieties or styles of type. By pressing the composed type form against the opaque polymer film, a suitable image-bearing transparency is thus obtained. Heat or selective use of solvents also clear the desired portions; however, the use of pressure or a combination of pressure and heat is preferred since it is less critical and requires little in the way of special equipment or skill. The requirements of clarification are such that the films that qualify are opaque polymer films having open cell pores that are of a number and size necessary for opacity (and optionally for ink, dye, or similar deposition in the pores).

Although the opaque polymer films obtained as in my Patents 2,846,727 and 2,848,752 are particularly useful and preferred, I can also use other films or coatings of organic polymers that exhibit the necessary properties of porosity, opacity, and clarification. The methods of producing other useful films include treatments of a substantially transparent film of a vinyl-type polymer or condensation polymer by solvents, followed by non-solvents to give opaque films, layers, or coatings that have the necessary properties.

Other films, although less preferred, that are opaque, porous, and become substantially transparent under pressure can be used in my process. Included are cellulose acetate films as obtained by mixing finely ground cellulose acetate in a 50/50 mixture of tetramethylurea/tert. butyl alcohol to form a dispersion, casting a film on glass, drying and washing the film. A cellulose film obtained by boiling 450 gauge cellophane for ¼ hour in ethanol, ¼ hour in benzene, and ¼ hour in pentane has the necessary porosity and pressure clarifiable properties to be useful in the process of this invention. A further opaque film that has been obtained is of polycaproamide, resulting from casting a solution of the polymer in calcium chloride and methanol (in a ratio of 4 parts of polymer to 6.6/13.3 of $CaCl_2 \cdot 2H_2O/CH_3OH$) and drying at 60° C., followed by washing in water.

In my process, the opaque film can be a homogeneous strong unsupported film, or the opaque film portion can be a layer on a transparent, flexible, dimensionally stable base material. In general, the films or film coatings that are initially opaque and porous have a thickness at least 0.2 mil and usually up to 10 mils, preferably 0.5–2.0 mils.

In my printing process, the image-bearing films obtained from initially opaque, organic-polymer films that have been subjected to selective clarification by pressure are positioned next to an unexposed or raw photosensitive plate material. Usually, the plate and image-bearing transparency are in contact during the light exposure period. However, under certain conditions, they can be separated, e.g., an inert transparent film or a screen can be placed between them if the printing plate material and image-bearing film are of such materials that any degradation of either would occur if direct contact is made, or if special screen effects are desired in the finished printing plate.

Photosensitive plates useful in the processes of this invention include (1) the photopolymerizable plates such as previously described and those described in U.S. Patents 2,892,716, 2,893,868, 2,902,365, 2,923,673, 2,927,022, 2,927,023, 2,929,710, 2,948,611 and 2,951,758, (2) plastic plates topcoated with a thin photosensitive layer that is selectively exposed to light and in its subsequently developed state is used as a resist while the plastic is selectively etched with a solvent, (3) various presensitized lithographic plates, such as paper or metal based, including those bearing albuminoid coatings (4) deep etch plates, and (5) certain bimetallic plates. The final plates can be flat or curved.

Some methods of printing from photosensitive elements, e.g., rotogravure and silk screen, employ a positive for exposure to light. For these, a conventional photopositive can be prepared from the selectively clarified film.

For certain short-run reproductions as in mapping, construction blueprints, proofs and template preparation, the selectively clarified and optionally post-densified film may be used directly for exposing a photosensitive composition.

The process of this invention offers several further advantages not achieved by conventional methods of production of printing plates from photosensitive materials starting with type forms, engravings, or similar objects having a variation in relief. In the first place, the selective clarification of the opaque polymer film is rapid, e.g., it involves only simple pressing of the typeface onto the film or vice versa. Lower costs are evident since preparation of one or more photonegatives become unnecessary. Furthermore, images of greater detail and fidelity are obtained than in such prior art processes as those in which conventional photographic negatives are produced by taking a picture of type forms, the upper surfaces of which have been polished (bright-type process) or by taking a picture of a reproduction proof prepared by inking a type form and printing therefrom on paper and in which negatives so produced are used as masks in the exposure to light of photosensitive printing compositions. In addition, the process of this invention is much more versatile than the production of negatives by photocomposition because any of the numerous sizes and shapes of type, engravings, etc., possessed by printers can be employed to produce the desired image in the opaque film or the desired image may be produced by handscribing, use of typewriter, "Vari-Typer," or numerous other means of selectively clarifying the opaque film.

Since many different embodiments of the invention may be made without departing from the spirit and scope thereof, it is to be understood that the invention is not limited by the specific illustrations except to the extent defined in the following claims.

I claim:

1. A process for making an image suitable for forming a printing image which comprises:

(a) clarifying, imagewise, areas of an opaque, pressure-clearable film of an organic polymer having open-cell microscopic voids by collapsing open-cell voids in such areas forming clear images areas, without removing polymer from the clear image areas, and (b) passing light through the resulting clear image areas to expose a light-sensitive image-yielding element and form an image therein corresponding to the clear image areas.

2. A process according to claim 1 wherein the areas are clarified by applying pressure to at least one surface of the opaque film from its relief surfaces of a printing relief.

3. A process according to claim 1 wherein said opaque film is self-supporting and has a thickness from 0.2 to 10 mils.

4. A process according to claim 1 wherein the image-yielding element contains as the light-sensitive layer an addition photopolymerizable layer.

5. A process according to claim 1 wherein prior to step (b) the unclarified background areas are increased in optical density by deposition of opaque material in such areas to provide a high contrast image-bearing layer.

6. A process according to claim 1 wherein said opaque film is on a transparent, flexible dimensionally stable support.

7. A process for making an image suitable for making a printing image which comprises:

(a) clarifying, imagewise, areas of an opaque film from 0.2 to 10 mils in thickness of an organic polymer having open-cell, microscopic substantially uniform voids of average size less than a micron in diameter and constituting 20–80% of the volume of said opaque film and having light transmission of less than 10% at 4000 A., exhibiting a reduction in thickness of 20–80% when subjected to substantial pressure at room temperature and an increase in light transmission at least three-fold with a substantial absence of microscopic voids, by applying pressure to at least one surface of the film is said areas thereby collapsing open-cell voids in such areas and forming clear image areas without removing polymer from the clear image areas, and (b) passing light through the resulting clear image areas to expose a light-sensitive image-yielding element and form an image therein corresponding to the clear image areas.

8. A process for making an image suitable for making a printing image which comprises:

(1) clarifying, imagewise, areas of a porous, opaque, non-fibrous, pressure-clearable film from 0.2 to 10.0 mils in thickness, said film being of low bulk density composed of partially coalesced discrete particles of a hydrophobic organic addition polymer of at least one ethylenically unsaturated monomer selected from the group consisting of vinyl and vinylidene monomers, said polymer having a wholly carbon chain, and a molecular weight of at least 10,000, the units of the polymer having an average molecular weight of less than 150; said film having an open-cell structure characterized by microscopic voids uniformly disposed throughout and communicating with its surface, the open-cell voids being of substantially uniform size, averaging less than one micron in their greatest diameter and constituting 20% to 80% by volume of the film, said film (a) having a degree of opacity such that a thickness of 3 mils and greater has a light-transmission of less than 10% at 4000 A., and upon being subjected to a pressure of 10,000 lbs. per sq. in. at room temperature has at least a 3-fold increase in light transmission, and (b) sustaining a permanent reduction in thickness of about 20% to about 80% when subjected to such temperatures and pressures, by applying pressure to at least one surface of the film in said areas from the relief surface of a printing relief thereby collapsing open-cell voids in such areas and forming clear image areas without removing polymer from the clear image areas, and (2) passing light through the resulting clear image areas to expose a light-sensitive image-yielding element and form an image therein corresponding to the clear image areas.

9. A process according to claim 8 wherein said opaque film is self-supporting.

References Cited in the file of this patent

UNITED STATES PATENTS

| | | |
|---|---|---|
| 2,016,599 | Graves | Oct. 8, 1935 |
| 2,195,556 | Beattie et al. | Apr. 2, 1940 |
| 2,321,046 | Rudnick | June 8, 1943 |
| 2,383,566 | Rudnick | Aug. 28, 1945 |
| 2,383,567 | Rudnick | Aug. 28, 1945 |
| 2,519,660 | James | Aug. 22, 1950 |
| 2,552,233 | Tate et al. | May 8, 1951 |
| 2,961,334 | Clancy et al. | Nov. 22, 1960 |
| 2,964,401 | Plambeck | Dec. 13, 1960 |